United States Patent [19]

Steinel et al.

[11] Patent Number: 5,008,613
[45] Date of Patent: Apr. 16, 1991

[54] VOLTAGE TESTER FOR GRADUATED OPTICAL DISPLAY OF A VOLTAGE AND METHOD FOR ITS MANUFACTURE

[75] Inventors: Heinrich-Wolfgang Steinel, Bad Woersihofen; Ulrich Armonier, Rheda-Wiedenbrueck; D-F Schulze-Froehlich, Herzebrock-Clarholz, all of Fed. Rep. of Germany

[73] Assignee: Siemens Aktiengesellschaft, Munich, Fed. Rep. of Germany

[21] Appl. No.: 397,530

[22] Filed: Aug. 23, 1989

[30] Foreign Application Priority Data

Aug. 26, 1988 [EP] European Pat. Off. ........ 88113986.9

[51] Int. Cl.$^5$ .................... G01R 19/14; G01R 31/00
[52] U.S. Cl. ..................................... 324/133; 324/122
[58] Field of Search ............... 324/122, 96, 133, 556; 340/753, 754, 761, 762

[56] References Cited

U.S. PATENT DOCUMENTS

| | | |
|---|---|---|
| 4,028,621 | 6/1977 | Bloxam ........................... 324/133 |
| 4,210,862 | 7/1980 | Koslar . |
| 4,301,407 | 11/1981 | Koslar . |
| 4,527,118 | 7/1985 | Koslar . |

FOREIGN PATENT DOCUMENTS

| | | |
|---|---|---|
| 2060884 | 6/1972 | Fed. Rep. of Germany . |
| 2846674 | 4/1980 | Fed. Rep. of Germany ...... 324/133 |
| 3148382 | 6/1983 | Fed. Rep. of Germany . |
| 0273693 | 11/1989 | Fed. Rep. of Germany ...... 324/133 |
| 0201169 | 9/1986 | Japan .................... 324/133 |

*Primary Examiner*—Kenneth Wieder
*Assistant Examiner*—Jose M. Solis
*Attorney, Agent, or Firm*—Hill, Van Santen, Steadman & Simpson

[57] ABSTRACT

A voltage tester for the graduated display of a voltage applied to two test tips includes a circuit arrangement composed of a parallel connection of three series circuits whereby a PTC-resistor, an antiparallel connection of two light-emitting diodes, and voltage drop resistors are contained in two of the series circuits. Two Zener diodes connected oppositely to one are also contained in the second series circuit, and the third series circuit is composed a glow lamp and voltage drop resistors. The components of the voltage tester are accommodated in a handle connected by a cable to a second handle which a current limiting resistor. Preferred embodiments of the voltage tester and a preferred embodiment of the manufacturing method therefore are proposed.

8 Claims, 3 Drawing Sheets

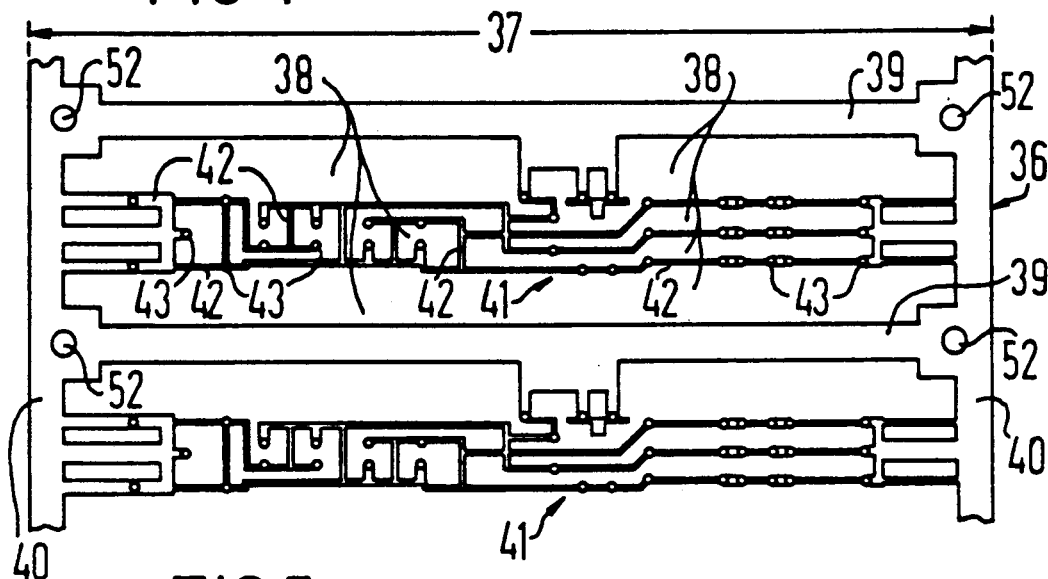
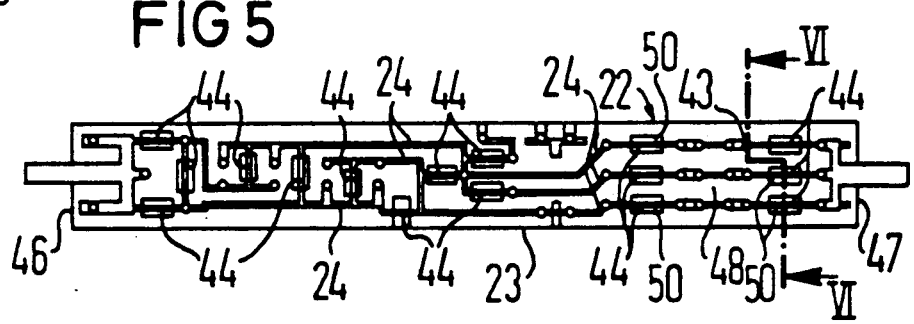
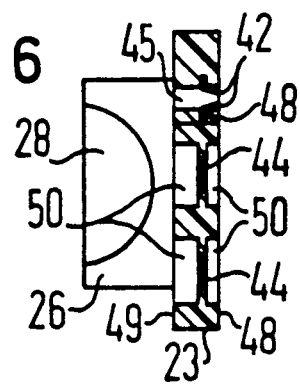
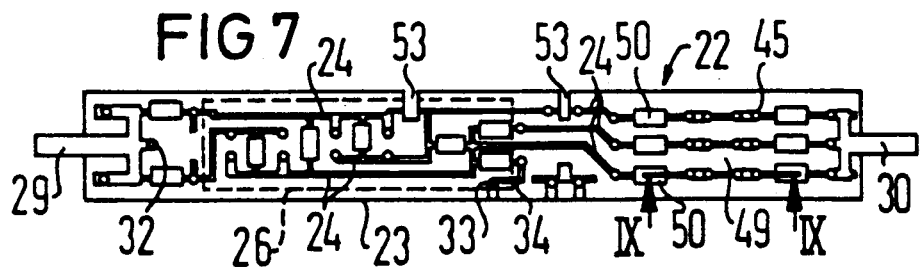

VOLTAGE TESTER FOR GRADUATED OPTICAL DISPLAY OF A VOLTAGE AND METHOD FOR ITS MANUFACTURE

BACKGROUND OF THE INVENTION

1. Field of the Invention

The present invention is directed generally to a voltage tester for optically displaying graduated voltage levels applied to test tips, or probes. The voltage tester includes a circuit arrangement of electrical components including a first series circuit composed of a first PTC-resistor, two light-emitting diodes connected antiparallel to one another and at least one drop resistor that is balanced so that one or both light-emitting diodes light up when a voltage exceeding a particular level of, for example, 4.5 volts and, in particular, 6 volts is applied to the test tips.

The invention is directed particularly to a voltage tester wherein individual electrical components having power leads are accommodated in the overall circuit arrangement of a device composed of two handles that are connected to one another by a connecting cable. The device also includes test tips or probes as well as openings in the handles through which the optical display components are observed.

The present invention is also directed to a method for manufacturing a voltage tester.

2. DESCRIPTION OF THE RELATED ART

German Patent 20 60 884 discloses a test means for indicating the polarity or phase relation of electrical potentials relative to a prescribed reference potential. The reference potential, in particular, periodically changes between two potentials in switching devices having ambivalent switching variables in the form of a reference potential whose value differs on the basis of a phase difference of 180°. The test means uses a series circuit composed of two light-emitting diodes antiparallel to one another as well as a preceding, current-limiting resistor. The two light-emitting diodes are arranged protected in at least one opening of a grip-shaped housing which also contains the current-limiting resistor and which carries a metal tip at its face end. The grip-shaped housing includes an oblong opening which is covered by a light transmissive material and behind which is arranged for protection the two light-emitting diodes following one another with their light-emitting sides directed outwardly. At one end, the grip-shaped housing carries a part of an electrical plug connection for accepting a corresponding other part which includes a test line.

An improvement in the above-described test means is disclosed in U.S. Pat. No. 4,210,862 by which a test can also be carried out for current conduction through a line by using an additional circuit with a battery. All components of the disclosed device are accommodated in a handle that is provided with a test tip and which is connected via a cable to a second handle that also has a test tip.

The light emitting diode pairs in these are connected antiparallel to one another. In other words, the diodes are connected parallel to one another with their respective polarities reversed so that the anode lead of one diode is connected to the cathode lead of the second diode. The antiparallel connection of the two light emitting diodes results in only the light emitting diode which is switched to the conducting mode lighting up when a DC voltage is applied to the test tip, while the second light emitting diode is in a non-conductive, inhibiting mode. The polarity of the DC voltage connected to the appertaining test tips determines which of the two light emitting diodes lights up. When an alternating voltage is applied to the two test tips, logically, both light emitting diodes light up.

European Patent Document B 0 011 711, corresponding to U.S. Pat. No. 4,301,407, discloses a test means for graduated display of a test voltage which includes two handles provided with contact tips that are connected by a cable. One of the handles contains a display unit which has a series circuit of non-linear luminance elements, as well as a voltage divider composed of a plurality of series connected resistors, the series circuit being charged by a test voltage. The base of a transistor is connected to each of the taps of the voltage divider formed by the junction of the resistors. The emitters of these transistors are connected to one lead, or post, of one of the luminance elements, and the collector of the transistor is connected to the collectors of the remaining transistors as well as to a lead or pole of a power supply whose other pole is connected to other lead of the luminance elements at the end of the series circuit. FIG. 4 of the European and corresponding U.S. patent, as well as the appertaining description, discloses a circuit containing further light emitting diodes as well as glow lamps, in addition to an antiparallel circuit of two light emitting diodes that are connected in series with a PTC-resistor.

The test devices described above exhibit a number of considerable advantages in practical applications. Such advantages include, among other things, that the voltage to be tested is displayed in graduated fashion divided into a greater number of voltage ranges, for example, including voltage ranges between at 6 volts, 12 volts, 24 volts, 50 volts, 110 volts, 220 volts, 380 volts, and 600 volts. Nonetheless, the outlay or expense both in view of the necessary electrical components as well as in view of the manufacture of both the motherboard carrying the components and printed interconnects as well as the equipping thereof with the electrical components is extremely high.

European patent document B 0 068 501, corresponding to U.S. Pat. No. 4,527,118, discloses a test means of the type described above that is again improved. In addition to the previous, graduated display of the voltage to be identified, the test means also provides for the possibility of testing an electrical line for current conduction, for which purpose a battery is contained in the circuit. Additional possibilities include carrying out a function test of individual components and identifying voltage sources having high internal resistances, i.e., voltage sources that are not mains voltage sources, by preconnecting a high impedance drop resistor and a connectable load resistor circuit composed of a plurality of PTC-resistors and normal resistors. One of the two handles of the test means that are connected to one another by a cable accommodate at least one high impedance drop resistance and the load resistor circuit.

Due to their advantages, a great number of the test devices described above are in use.

However, it has also been shown that less of a graduation of the individual display ranges for the voltages to be identified is adequate for many applications. For example, the display of voltage ranges beginning with 4.5 volts, beginning with 50 volts, and beginning with 110 volts are advantageous. The two first voltage ranges are still relatively non-hazardous to the individual operating the voltage tester, although voltages above 110 volts are extremely dangerous, particularly when voltage levels of 220 or even 380 voltage are exceeded. It is, therefore, adequate to provide an unambiguous optical display that contrasts with the other voltage ranges for this last voltage range.

German published application 31 48 382 discloses an electrical means, and particularly an electrical tool, with plugable components and a connection plate for plugging and connecting the components to one another and/or to the power supply. The connecting plate comprises a network of conductive metal strips or wires that are embedded in plastic. Electrical components such as, for example, electrical resistors, light emitting diodes, Zener diodes or PTC-resistors are applied to this connecting plate.

SUMMARY OF THE INvENTION

It is an object of the present invention to provide a voltage tester which meets the simplified demands set forth above but is thereby adequately safeguarded for the operator during use.

Another object of the invention is to provide an especially simplified circuit arrangement for a voltage tester which can be simply manufactured as a result of the possible, three-dimensional design and which operates with few electrical components.

Another object of the invention is to provide a method for manufacturing a voltage tester.

To achieve these and other objects underlying the invention, the voltage tester of the present invention not only has a circuit arrangement containing a first series circuit composed of a first PTC-resistor, two light emitting diodes connected antiparallel, and at least one drop resistor so that one or both light emitting diodes light up when a voltage of a first voltage level is applied to the test tips but also includes the further features of:

at least a second series circuit composed of a second PTC-resistor, two light emitting diodes connected antiparallel to one another, two Zener diodes connected in series and oppositely polarized relative to one another, and at least one voltage drop resistor connected in parallel to the first series circuit, said at least one second series circuit being balanced so that one or both light emitting diodes light up when a voltage is applied to the test tips which exceeds a second voltage level of, for example, 40 volts and, in particular, 50 volts;

a third series circuit composed of a glow lamp and at least one drop resistor connected in parallel to the first series circuit and to the at least one second series circuit, the third series circuit being balanced so that the glow lamp lights up when a voltage exceeding a third level of, for example, 110 volts and, in particular, 120 volts is applied to the test tip; and a current limiting resistor is connected in series with the three series circuits.

A preferred voltage tester is characterized by the following features:

In the first series circuit, the first PTC-resistor has a resistance value of between approximately 3.2 through 4.6 k ohms, the light emitting diodes are connected in the circuit so that they illuminate at approximately 4.5 volts, and in particular at 6 volts, and two voltage drop resistors are present in the circuit, each of which has a resistance value of approximately 1 k ohm at a power of 1 watt;

In the second series circuit, the second PTC-resistor has a resistance value of approximately 3.2 through 4.6 k ohms, the light emitting diodes are, connected in the circuit to illuminate at 40 volts, and in particular at 50 volts, two voltage drop resistors are present in the series circuit, each of which has a resistance value of approximately 1 k ohm at a power level of 1 watt, and the two Zener diodes have a breakdown voltage of from approximately 35 to 40 volts;

In the third series circuit, two voltage drop resistors are present, each of which has a resistance value of approximately 75 k ohms at a power level of 1 watt, and the glow lamp is connected in the circuit for illumination at 110 volts and in particular at 120 volts; and The current limiting resistor has a resistance value of approximately 220 ohms at a power level of 1 watt.

A preferred embodiment of this voltage tester has the features already cited and is inventively characterized by the following features:

The current limiting resistor is accommodated in a handle;

The remaining electrical components of the three series circuits are accommodated in a second handle and are situated therein on a system carrier adapted to the cavity of the handle and are connected to one another in electrically conductive fashion by lines composed of sheet metal;

The system carrier is composed of a one-piece, elongated insulator envelope in which the lines connecting the components are embedded so that they penetrate the lower side of the insulator envelope only at solder locations;

The insulator envelope is provided with a cap integrally connected thereto which contains round recesses in which the light emitting diodes are accommodated and which also contains an oblong recess in which the glow lamp is accommodated;

The system carrier includes terminal lugs at its opposite ends which project out of the insulator envelope.

A first of the terminal lugs is connected to the test tip and the other terminal lug is connected to the connecting cable.

The voltage tester of the invention provides an advantage when a cable is provided to connect the glow lamp to the terminal lug and that proceeds from a solder point of the terminal lug, and is conducted along the cap of the insulator envelope to a solder point of an embedded connecting line which is connected to one pole of the glow lamp. It is, of course, possible to replace this cable with an interconnect such as a punched interconnect.

An especially simple embodiment of the voltage tester is characterized by the components being arranged on the upper surface of the system carrier in the following fashion:

The two PTC resistors are in parallel to one another in a longitudinal direction and are at the front end of the system carrier;

The cable begins between the two PTC resistors and proceeds to the outside of the cap to a solder point which is bent at a right angle a corresponding number of times;

The light emitting diodes are arranged in a single row in the middle of the system carrier, running longitudinally thereof, and accommodated in round recesses in the cap;

The glow lamp is situated in an oblong recess of the cap following the last of the light emitting diodes;

The Zener diodes are arranged transversely relative to the longitudinal direction of the system carrier and following the glow lamp;

The drop resistors of the first series circuit are arranged successively and in a longitudinal direction of the system carrier near one edge of the surface side;

The drop resistors of the second series circuit are arranged parallel to the drop resistors of the first series circuit and near the other edge of the surface side; and The drop resistors of the third series circuit are arranged parallel to and between the drop resistors of the first and second circuits.

The method of the present invention for manufacturing a voltage tester is characterized by the following steps in this sequence or in a corresponding sequence;

(a) From a sheet metal ribbon coated with a solderable layer, the ribbon having a thickness of from approximately 0.1 through 1.0 mm and a width that is greater than the whole-numbered, one-fold through five-fold multiple of the length of the system carrier together with the terminal lugs, punching out all interspaces between residual connections of remaining edge strips of the sheet metal ribbon and an arrangement of metal and between these metal strips so that the metal strips of this arrangement correspond to the later pattern of the connecting lines of the system carrier and so that via holes for the power lead wires of the components are provided;

(b) Supplying the punched self-supporting sheet metal ribbon to a tool for injection molding in casting encapsulation where each of the arrangements is at least individually embedded in insulator material that forms the insulator envelope with a cap after curing, whereby the terminal lugs project at the ends;

(c) Supplying the sheet metal ribbon pre-treated in such fashion to a further press tool to remove the parts that were previously necessary to hold the punched sheet metal ribbon together but that are not subsequently necessary for the interconnection of the electrical components in the system carrier connecting lines of the system carrier. Furthermore, the openings produced in the insulator envelope in the region of the via holes and the parts of the metal strips surrounding the via holes are pressed to the lower surface side of the insulator envelope;

(d) Equipping the system carriers with electrical components that are connected to the lines in electrically conductive fashion and in mechanical fashion to the lower surface side by flow soldering or by dip-soldering, either before or after the detaching of the system carriers;

(e) Accommodating every system carrier in the cavity of a handle, connecting the terminal lugs either previously or subsequently to the test tip or to the connecting cable that is already attached to the other handle which contains the current-limiting resistor, and thereafter closing the handle.

The measure provided in method step (c) wherein the parts of the metal strips surrounding the via holes are pressed out of the plane of the metal strip in the direction in of the lower surface side of the insulator envelope is preferably carried out during method step (a) though the use of a press tool.

It is also advantageous when elevations in the injection molding form or in the casting form are provided in method step (b) during the manufacture of the insulator envelope so that both openings in the region of the via holes as well as the depressions proceeding from one or both surface sides of the insulator envelope arise. These depressions extend up to the parts of the metal strips that are to be removed.

The present method is based upon a sheet metal ribbon which contains all necessary connections and is processed by etching or punching but is still held together by additional parts in the individual lines. It is extremely economical to manufacture such sheet metal ribbons in a high-speed punching device such as in high piece numbers in a conveyor line.

Following the foregoing procedure, the sheet metal ribbon is supplied to an injection tool for thermoplastic synthetic material where is it extrusion coated with a plastic material. For example, the material may be filled or unfilled epoxy resin, or, given use of molding forms, the metal ribbon is cast intregally therewith. The injection tool may be a multiple tool by which one or a plurality of interconnect arrangements is formed by the injection tool in one injection event. In a further work cycle, all of the connections that previously served to hold the punched ribbon but should not be present for the later electrical function are then punched out.

The punching event, or step, is followed by equipping the system carriers with the electrical components and by soldering of the power leads of the components to the metal parts surrounding the via holes. Subsequently, the test tip is soldered or welded, first, to the terminal lugs and, second, the connecting cable is soldered or welded to the terminal lugs. Up to this point in the manufacturing process, the finished system carriers may still remain connected to the parts of the sheet metal ribbon which are held by the residual connections and by the residual strips so that an especially simple mass production is possible. After this, the finished system carriers are detached and are fitted into the cavities of the respective handles of the devices.

The present invention provides a series of advantages. Among them are:

Production-Oriented Advantages:

From the sheet metal ribbon stage to the final detachment of the finished voltage testers, it is possible to automatically guarantee that the parts are conveyed without setting the parts down and picking them up again. During this conveyance, the parts are guided due to the geometry of the punched sheet metal ribbon and guidance is as precise as the punched sheet metal ribbon itself.

No other known production in electronics for the manufacture of such devices provides these advantages of continuous fabrication.

Electrical Advantages

According to various safety rules in force, such as, for example, the VDE-Vorschriften in the Federal Republic of Germany, a voltage tester such as in the present invention cannot be cost-effectively manufactured with a conventional motherboard having printed circuits due to the excessively small interconnect spacing and the inadequate air gaps and/or leakage paths therein. In particular, it is necessary to cast, or imbed, the entire circuit (the mother board and the interconnects) after it is finished. This procedure, however, is not suitable for mass production and is unacceptable due to the use of casting compounds and their solvents.

The present invention enables the interconnects to be completely extrusion coated and thus provides an extremely high degree of insulation. The required via holes or openings in the insulator in the region of the via holes are structurally designed so that all safety demands are met with respect to air gaps and leakage paths. In especially critical regions, a wall may be structurally inserted into a surrounding housing of the handle so that it passes through the openings and the via holes when the housing is assembled and thus enlarges the air gap. If the conductor spacings are to small in the horizontal direction, then part or all of the interconnects can be perpendicularly placed to restore the minimum spacings.

Mechanical Advantages

The material for the plastic envelope in the manufacture of the system carrier may be provided with all production aids for assembly without having to utilize extra parts, as was hitherto necessary. In case the necessary solder locations fall below the air gaps and leakage paths in terms of their position, this can be alleviated with injected separator rods that are applied to individual positions. Casting compound would be required in a conventional motherboard with printed interconnects.

Circuit-Oriented Advantages

The circuit of the present invention is extremely simple and nonetheless satisfies all safety demands. Transistors are completely eliminated from the circuit. This simplicity of the circuit makes it possible to manufacture a voltage tester without the need for special precautions during assembly since the individual electrical components, the PTC-resistors, the light-emitting diodes, the glow lamps, the Zener diodes, and the voltage drop resistors, can each be distinctly recognized and cannot be integrated at incorrect locations.

The simplicity of the device provides the possibility of designing the arrangement of interconnects so that they can be punched from a sheet metal without crossings being necessary and so that a conveyor means is simultaneously provided for a series of further method steps. The enveloping of the arrangement is quite simple and an especially simple arrangement of the individual components is possible, as well.

BRIEF DESCRIPTION OF THE DRAWINGS

FIG. 4 is a plan view of two interconnect arrangements which have been punched from a sheet metal ribbon in accordance with the invention;

FIG. 5. is a plan view of an arrangement of interconnects shown individually for simplification to illustrate interconnect parts which are to be removed;

FIG. 6 is a cross section along line VI—VI of FIG. 5;

FIG. 7 is a plan view of an upper side of an extrusion coated insulator carrier in which the parts to be removed are no longer present;

DETAILED DESCRIPTION OF THE PREFERRED EMBODIMENTS

Figure 1:
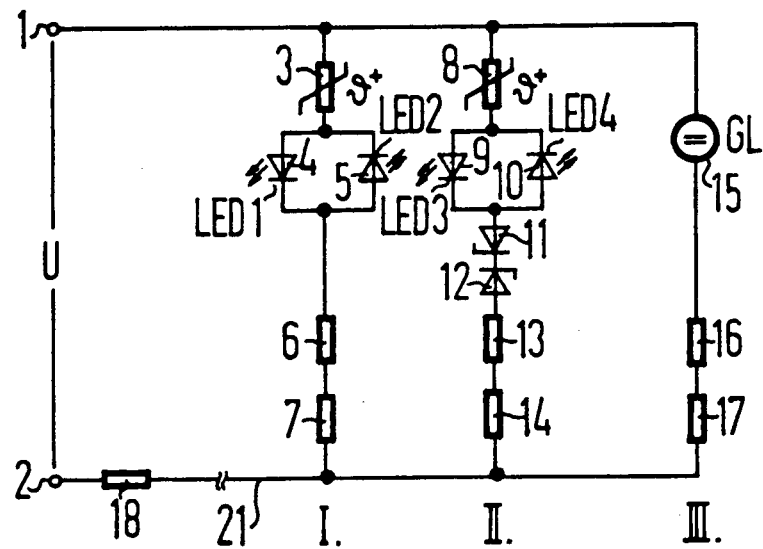
FIG. 1 is a circuit diagram of a circuit arrangement according to the principles of the present invention.

A circuit diagram is shown in FIG. 1 for the voltage tester of the present invention. A voltage U to be tested is applied between test tips 1 and 2, shown schematically. In the illustrated exemplary embodiment, the circuit arrangement is composed of three series circuit I, II and III that are connected in parallel. The first series circuit I is composed of a PTC (positive temperature coefficient) resistor 3, an antiparallel connection of two light-emitting diodes 4 and 5, also referred to as diodes LED1 and LED2, and of two voltage drop resistors 6 and 7.

The second series circuit II is composed of a PTC-resistor 8, an antiparallel connection of light-emitting diodes 9 and 10, also identified as LED3 and LED4, and of two Zener diodes 11 and 12 polarized oppositely to one another as well as of two voltage drop resistors 13 and 14.

In the third series connection III is provided a glow lamp 15 (GL) and of two voltage drop resistors 16 and 17.

Although two voltage drop resistors are shown in each of the three series circuits I, II and III, it is also possible to replace each pair of resistors with one voltage drop resistor having an appropriate resistance value. In the present context, by using two voltage drop resistors in place of one resistor, it is possible to, first, more precisely balance the value of resistances, and, second, to avoid excessive heating of the resistors at high loads.

A current-limiting resistor 18 is contained in the line 21 of the circuit of FIG. 1, which line 21 represents a connecting cable and which is connected in series with the parallel arrangement of the three series circuits I, II and III.

At least one further series circuit can be connected in parallel between the second and third series circuits II and III so that further voltage ranges are capable of being displayed in graduated fashion with this further series circuit by appropriate selection of the Zener diodes.

Figure 2:
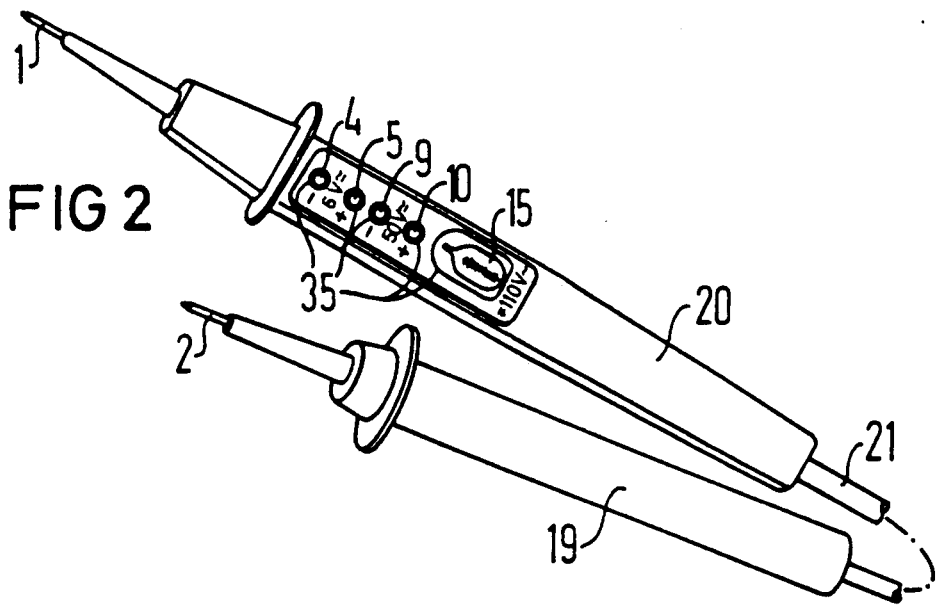
FIG. 2 is a perspective of view of a voltage tester device composed of two handles connected to one another by a cable according to the invention.

Referring now to FIG. 2, a voltage tester device is shown composed of handles 19 and 20 which are connected to one another by a connecting cable 21. The handle 19 carries the test tip 2 and contains the current limiting resistor 18 within the handle.

The second handle 20 carries the test tip 1 and is provided with openings 35 through which the components which serve as an optical display may be observed. Such optical display components include the light-emitting diodes 4, 5, 9, 10 and the glow lamp 15.

Figure 3:
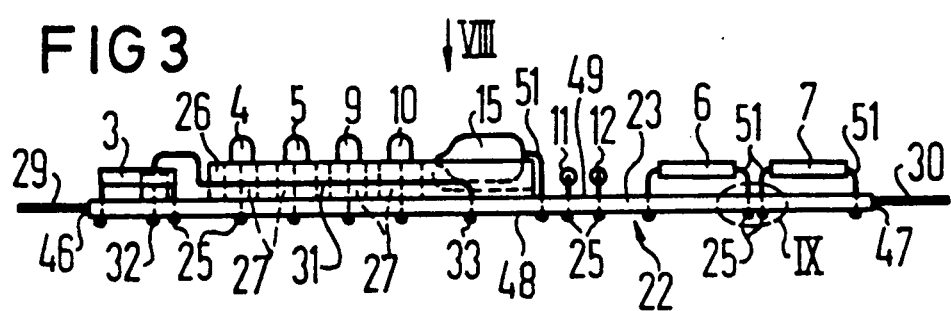
FIG. 3 is a side elevational view of a component equipped system carrier shown from the direction of arrow III in FIG. 8.
Figure 8:
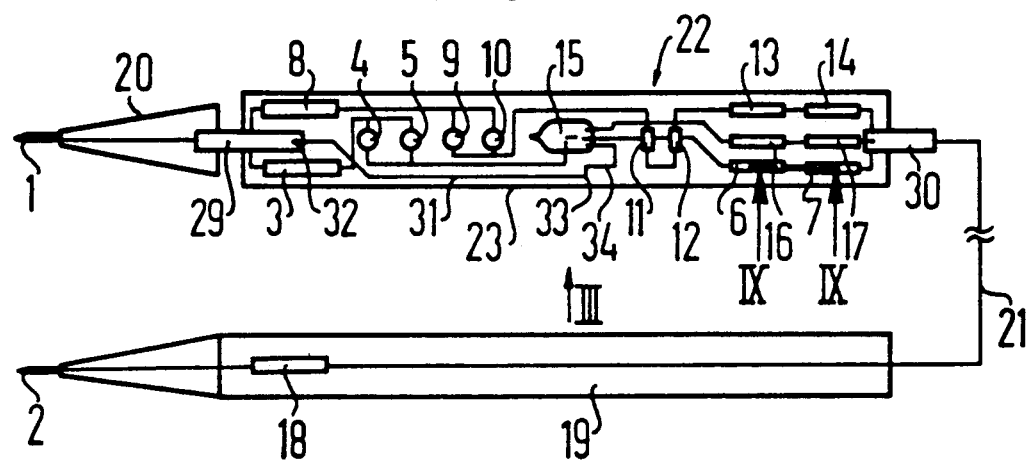
FIG. 8 is a plan view of the voltage tester of the present invention wherein the equipped insulator carrier in one handle is shown from the direction of arrow III in FIG. 3.

In a side view from the direction of arrow III in FIG. 8, FIG. 3 shows a completely equipped system carrier 22. The system 22 is composed of an insulator envelope 23 having a front end 46 with a terminal lug 29 and a back end 47 with a terminal lug 30. The terminal lugs 29 and 30 project out of the insulator envelope 23. On an upper surface side 49, the system carrier 22 has a cap 26 provided with four round recesses or openings, 27 and one oblong recess 28. Shown in FIG. 3 are the PTC-resistor 3, the light emitting diodes 4, 5, 9 and 10, the glow lamp 15, the two Zener diodes 11 and 12, as well as the voltage drop resistors 6 and 7. Each of the foregoing components have power leads 51 which extend through openings 45 in the system carrier 22, as will described in conjunction with FIGS. 4 through 7. The power leads 51 are electrically connected to lines 24 embedded in the insulator envelope 23. The electrical connections are provided on a lower side surface 48 of the insulator envelope 23 at solder locations 25.

A cable 31 is provided which connects the glow lamp 15 to the terminal lug 29 and which proceeds from a solder point 32 on the terminal lug 29 and is conducted along the cap 26 of the insulator envelope 23 to a solder point 33. The solder point 33 belongs to an embedded connecting line 34 as described in conjunction with FIG. 7 hereinafter, and that is connected to a power lead wire 51 of the glow lamp 15.

The present invention provides an improved method for manufacturing a voltage tester. The method for manufacturing a voltage tester in accordance with the present invention will be set forth hereinafter with reference to FIGS. 4 through 8.

FIG. 4 shows a sheet metal ribbon 36 which has undergone a first punching event. The sheet metal ribbon 36 has a width 37 which is selected such that it mounts to somewhat more than the whole numbered, single-fold through five-fold multiple of the length of the system carrier 22 together with the terminal lugs 29 and 30 (see also FIGS. 5 through 7). In other words, although the illustrated embodiment has a single row of the system carriers punched from a sheet metal ribbon, it is also possible to provide a sheet metal ribbon with 2, 3, 4, 5 or more rows of carriers punched from a single ribbon.

After the sheet metal ribbon 36 has been selected, all interspaces 38 which are present between residual connections 39 that connect remaining edge strips 40 to one another and an arrangement 41 of metal strips 42 as well as between the metal strips 42 are punched out. The punch pattern is designed so that the metal strips 42 of the arrangement 41 corresponds to the later pattern of lines 24 for the system carrier 22 (see also FIG. 7). The punch pattern also provides via holes 43 for the power lead wires 51 of the components 3 through 17. The sheet metal ribbon 36 has holes 52 serving as a conveying means which enables the sheet metal ribbon 36 to be conveyed from processing station to processing station. The holes 52 are provided in the remaining edge strips 40 of the sheet metal ribbon.

The sheet metal ribbon 36 which has been punched and is self-bearing in this fashion is subsequently supplied to a tool for injection molded enveloping or casting mold enveloping in which in each of the arrangements 41 is embedded in an insulator material, either individually or a plurality of such arrangements 41 is simultaneously embedded. This embedding forms the insulator envelope 23 with a cap 26 on its upper surface side 49 after curing.

In FIG. 5 is shown a single system carrier 22 provided with an insulator envelope 23, in a view from its lower surface side 48. The separation of the individual insulator carriers from the remaining residual strips 40 of the metal ribbon 36 preferably ensue in practice, however, only after the individual system carriers are equipped with the electrical components and after the power lead wires 51 are soldered to the lines 24 and, possibly also after the terminal lugs 29 and connected to the leads of the test tip 1 and to the cable 21. Thus, the single system carrier 22 of FIG. 5 is shown individually for the sake of simplicity, rather than connected to a conveying means, as is typically the case in continuous production of the present device.

So that no short circuits occur between the individual lines 24 or the bridging of the individual components, the sheet metal ribbon 36 which has been pre-treated in this fashion is supplied to a further press tool wherein the parts 44 that were previously necessary for holding the punched sheet metal ribbon 36 together but that are no longer necessary for the interconnection of the electrical components of the later pattern of lines 24 of the system carrier 22, are removed from the metal strips 42. Furthermore, openings 45 are produced in the insulator in the region of the via holes 43. The parts of the metal strips 42 surrounding the via holes 43 are pressed down to the lower surface side 48 of the insulator envelope during this punch event. It is possible that the offsetting of the parts of the metal strips 42 surrounding the via holes 42 toward the lower surface side 48 can already occur together with the punching arrangements 41 of the sheet metal ribbon 36.

Figure 9:
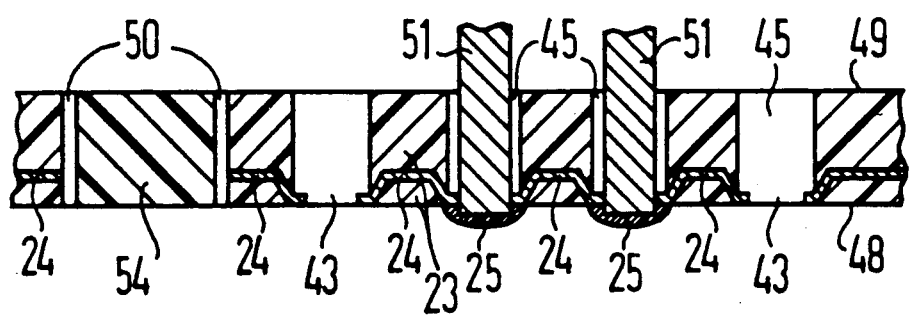
FIG. 9 is a enlarged cross section along line IX—IX in FIGS. 7 and 8.

In any case, it should be guaranteed that the lines 24 are embedded in the insulator material of the insulator envelope 23 and only accessible for the solder process at the surface parts required for soldering to the power lead wires 51 of the components. This is schematically illustrated in FIG. 6, which represents an enlarged cross section along line VI—VI of FIG. 5. The metal strip 42 projecting into the opening 45 is bent over toward the lower surface side 48 of the insulator envelope 23 so that it is possible to solder the bent over portions there, as shown in FIG. 9.

To facilitate removal of the parts 44 of the metal strips 42, it is advantageous to provide depressions 50 proceeding from either one or both sides 48 and/or 49. The depressions 50 correspond to the length of the part 44 to be removed but being somewhat broader than the metal strips 42. It is thus possible to perform the punch event in an especially simple way at these depression locations.

With reference to FIG. 7, a view onto the upper side surface 49 of the system carrier 22 is shown after the removal of the parts 44 and after the manufacture, or formation, of the openings 45 in the insulator envelope 23 the depressions 50 now extend from the upper surface side 49 to the lower surface side 48 of the system carrier 22 and so form through openings which represent insulating gaps, or paths. If the air gaps are not adequate as electrical insulation for especially high demands, then the depressions 50 can be filled with an insulator material, whereby the insulator material can be a web secured in the cavity of the grip 20, as already set forth above.

FIG. 7 also shows an embedded line 34 which extends from the solder point 33 to a solder point for the connection of the power lead wire 51 of the glow lamp 15. The cable 31 shown in FIG. 3 which connects the solder point 33 to the terminal lug 29 can also be replaced by a line connection which is likewise punched out of the sheet metal ribbon.

An especially simple possibility for interconnecting the elements of the simple circuit arrangement of FIG. 1 results from arrangement of FIG. 7, as can be very clearly seen.

To produce interruptions in the line 24 as shown along the upper edge of the system carrier 22 in FIG. 7, notches 53 are produced, such as during the punch event. In FIG. 8, is shown schematically the voltage tester as a device composed of the handles 19 and 20 that are connected to one another by the cable 21. The current limiting resistor 18 is shown in the handle 19. In the schematic illustration of FIG. 8, the housing is omitted from the handle 20 of the voltage tester so that individual electrical components 3 through 17 and the cable 31 extending from the solder point 32 to the solder point 33 may be seen in plan view. FIG. 8 shows an especially simple structure of the voltage tester device. In FIG. 9 is shown a portion IX in FIG. 3 and is a section along line IX—IX in FIGS. 7 and 8. FIG. 9 illustrates how the power lead wires 51 are connected to the lines 24 by solder locations 25.

It may be seen in FIG. 7 that more openings for the introduction of the power lead wires are present in the lines 24 in the right-hand region of the system carrier 22 than are subsequently required for the introduction of the voltage drop resistors 6, 7, 16, !7, and 13 and 14. This makes it possible that a certain amount of variation in the length of individual resistors is accommodated.

As shown in FIG. 9, the lines 24 are embedded in the insulator envelope 23 and extend to the surface side 48 only in the region of the openings 45. The through extending depressions, or openings, 50 represent an air gap between the remaining portions of the line 24. As already set forth above, if the insulation produced by the air gap is inadequate, the openings 50 can be filled with an insulator material 54.

Although other modifications and changes may be suggested by those skilled in the art, it is the intention of the inventors to embody within the patent warranted hereon all changes and modifications as reasonably and properly come within the scope of their contribution to the art.

We claim:

1. A voltage tester for graduated optical display of voltages, comprising:
    test tips to which a voltage is applied;
    circuit arrangement of electrical components connected to said test tips, said circuit arrangement including:
        a first series circuit connected across said test tips comprising a first PTC-resistor and a first pair of light emitting diodes connected antiparallel to one another and a first drop resistor, said first series circuit being balanced so that at least one of said two light emitting diodes lights up when a voltage exceeding a first value is applied to said test tips;
        a second series circuit comprising a second PTC-resistor and a second pair of light emitting diodes connected antiparallel to one another and two Zener diodes connected in series polarized oppositely of one another and a second drop resistor, said second series circuit being connected parallel to said first series circuit across said test tips, said second series circuit being balanced so that at least one of said second pair of light emitting diodes lights up when a voltage exceeding a second value is applied to said test tips;
        a third series circuit comprising a glow lamp and a third drop resistor, said third series circuit being connected parallel to said first series circuit and to said second series circuit across said test tips, said third series circuit being balanced so that said glow lamp lights up when a voltage exceeding a third value is applied to said test tips; and
    a current-limiting resistor connected in series with said first, second and third series circuits.

2. A voltage tester as claimed in claim 1, wherein said first value is 4.5 volts, said second value is 40 volts and said third value is 110 volts.

3. A voltage tester as claimed in claim 1, wherein said first value is 6 volts, said second value is 50 volts and said third value is 120 volts.

4. A voltage tester as claimed in claim 1, wherein said first PTC resistor has resistance value of approximately from 3.2 through 4.6 kilo-ohms,
    a further first resistor is connected in series with said ; first resistor and each of said first resistor and said further first resistor has a resistance value of about one kilo-ohm at a power of one watt,
    said second PTC resistor has a resistance value of approximately from 3.2 through 4.6 kilo-ohms,
    a further second resistor is connected in series with said second resistor and each of said second resistor and said further second resistor has a resistance value of about one kilo-ohm at a power of one watt,
    said Zener diodes have a breakdown voltage in a range of approximately 35 through 40 volts,
    a further third resistor connected in series with said third resistor and each of said third resistor and said further third resistor having a resistance value of approximately 75 kilo-ohms at a power of one watt, and
    said current limiting resistor has a value of approximately 220 ohms at a power of one watt.

5. A voltage tester as claimed in claim 4, wherein said first series circuit is designed to illuminate said first light emitting diodes when a voltage exceeding 4.5 volts is applied across said test tips,
    said second series circuit is designed to illuminate said second light emitting diodes when a voltage exceeding 40 volts is applied across said test tips, and
    said third series circuit is designed to illuminate said third light emitting diodes when a voltage exceeding 110 volts is applied across said test tips.

6. A voltage tester as claimed in claim 1, further comprising:
    two handles mounting said test tips, said current-limiting resistor being in a first of two handles;
    a cable connecting said two handles to one another;
    a system carrier on which said electrical components of said circuit arrangement are mounted, said system carrier being accommodated in a second of said two handles, said system carrier including:
        lines of sheet metal connecting said electrical components to one another in electrically conductive fashion,
        a one piece elongated insulator envelope in which said lines are embedded, said lines penetrating a lower side surface of said insulator envelope only at solder locations,
        a cap integrally joined to said insulator envelope, said cap having recesses in which said light emitting diodes and said glow lamp are accommodated, and
        terminal lugs projecting out of opposite ends of said insulator envelope, one of said terminal lugs being connected to a first of said test tips and a second of said terminal lugs being connected to said cable.

7. A voltage tester as claimed in claim 6, further comprising:
    a line cable connected between said first of said terminal lugs and said glow lamp, one end of said line cable being connected to a solder location on said first of said terminal lugs, an opposite end of said line cable being connected to a solder location on one of said lines of sheet metal which is connected to a lead of said glow lamp.

8. A voltage tester as claimed in claim 6, wherein an upper surface side of said system carrier has:

said first and second PTC-resistors arranged in parallel in a longitudinal direction of said system carrier at a front end thereof, said line cable beginning between said first and second PTC-resistors and proceeding at an outside of said cap, said light emitting diodes arranged in a row in a middle of said system carrier in a longitudinal direction, said glow lamp arranged following said light emitting diodes, said Zener diodes arranged transversely of said system carrier following said glow lamp, said drop resistors of said first series circuit arranged following one another in a longitudinal direction of said system carrier proximate an edge of said upper surface side, said drop resistors of said second series circuit arranged parallel to said drop resistors of said first series circuit proximate an opposite edge of said upper surface side, and said drop resistors of said third series circuit arranged parallel to and between said drop resistors of said first series circuit and said second series circuit.

* * * * *